June 2, 1970 E. K. HOWELL 3,515,902

SYNCHRONOUS SWITCHING CIRCUIT

Filed Oct. 18, 1965 3 Sheets-Sheet 1

Inventor:
Edward K. Howell,
by Henry J. Marmiroli
Attorney.

June 2, 1970 E. K. HOWELL 3,515,902

SYNCHRONOUS SWITCHING CIRCUIT

Filed Oct. 18, 1965 3 Sheets-Sheet 2

Inventor:
Edward K. Howell,
by Henry J. Mariniak
Attorney.

SYNCHRONOUS SWITCHING CIRCUIT

Filed Oct. 18, 1965 3 Sheets-Sheet 3

Inventor:
Edward K. Howell,
by Henry J. Moreau[?]
Attorney.

United States Patent Office 3,515,902

Patented June 2, 1970

3,515,902

SYNCHRONOUS SWITCHING CIRCUIT

Edward K. Howell, Skaneateles, N.Y., assignor to General Electric Company, a corporation of New York Filed Oct. 18, 1965, Ser. No. 497,056
Int. Cl. H03k *17/00*
U.S. Cl. 307—252 4 Claims

ABSTRACT OF THE DISCLOSURE

A circuit for controlling current flow from an alternating-current source through a load includes a first gate controlled conducting device connected to the load and the source. The gate electrode of the first gate controlled device is connected in the circuit normally to receive a gating signal. A second gate controlled connecting device is connected to shunt the gating signal from the first gate electrode when the second gate controlled device conducts. The gate electrode of the second gate controlled device is connected in the circuit to begin and thus continue conducting during one half-cycles of the source voltage, so that the first gate controlled device can begin to conduct only at the beginning of a half-cycle of the source voltage.

This invention relates to current control circuits and, more specifically, to control circuits for switching relatively high enregy to a load.

This present invention is an improvement over the invention of the application of Frank W. Gutzwiller, Ser. No. 438,886, filed on Mar. 11, 1965, now Pat. No. 3,335,291 and assigned to the assignee of the present application, which invention was made by said Frank W. Gutzwiller prior to this invention. Therefore, said Gutzwiller application is to be regarded as prior art with respect to this present application which does not claim anything shown or described in said Gutzwiller application.

As set forth in the aforecited application, it is not uncommon to have communications interference problems arise as a result of radio and audio frequency noise signals which are generated when a high power circuit is closed or opened. With the application of a voltage pulse to a circuit component to close the circuit at some point in a power source voltage wave, both the sudden pulse and the source voltage may cause oscillations among reactive circuit components and thus the generation of noise signals. These noice signals often interfere with radio reception. In addition, when the switching is accomplished with mechanical switches, there is an additional problem of noise signals generated by contact bounce. A further aggravation of this problem is found when a high power circuit is opened in a random manner. Current flow is abruptly terminated also causing radio and audio noise signals to be generated. To eliminate the effects of such objectionable noise signals, expensive and cumbersome RF and audio filters have been used in many high power switching circuits.

It has been found experimentally that most A-C circuits generate a minimum of noise signals if they are opened when the circuit current is zero, and if they are closed when the source voltage is zero. When gate controlled conducting devices, such as the SCR, are used as switching components, they minimize some of the noise problems due to their inherent latching characteristics. That is to say, once they are turned on they can turn off only when a current flowing through them is zero. For example, an SCR opens a circuit when the current flow through it reaches zero, and as long as a gate drive current has been removed from the gate electrode of the SCR it will not begin to conduct again. Thus, the gate controlled conducting devices operate in accordance with one of the experimentally found conditions for generating a minimum of noise signals. However, even using gate controlled conducting devices, noise frequencies are generated when the circuit is closed and must be eliminated by means of filters.

The aforecited application provided a current controlling circuit in which a gate controlled conducting device having a gate electrode is connected to a power source and a load to control the energization of the load. A seminconductor device having a control electrode is connected to the gate electrode of the gate controlled device to control the conduction state thereof. The semiconductor device is so connected to the gate electrode that the conduction state of the gate controlled device may change when the energization state of the semiconductor device changes. The seminconductor device in turn is connected to the source voltage by means of circuit components which control the energization state of the seminconductor device. A number of circuit components, setting up a type of logic circuit, were needed to control the energization state of the semiconductor device. For some applications of this circuit it has been found that the use of these circuit components may be undesirable due to the relative complexity of the circuit, as for example, where it is used for thermal control purposes, and to the increase in the cost they impose.

Therefore, it is an object of this invention to provide an improved, simplified control circuit which closes only when the source voltage is zero.

It is another object of this invention to provide an improved, more inexpensive control circuit which switches with a minimum of RF and audio noise interference.

It is still another object of this invention to provide a simplified circuit for closing only when the source voltage is zero, which circuit may be used more advantageously for continuous, automatic control purposes.

Briefly stated, and in accordance with one aspect of this invention, a current controlling circuit, such as that described above, is provided in which a second gate controlled conducting device is connected to the gate electrode of the first gate controlled conducting device so that the conduction state of the first gate controlled conducting device may change when the conduction state of the second gate controlled conducting device changes.

While the specification concludes with claims particularly pointing out and distinctly claiming the subject matter which is regarded as this invention, it is believed that the invention will be better understood from the following description taken in connection with the accompanying drawings in which:

Figure 1:
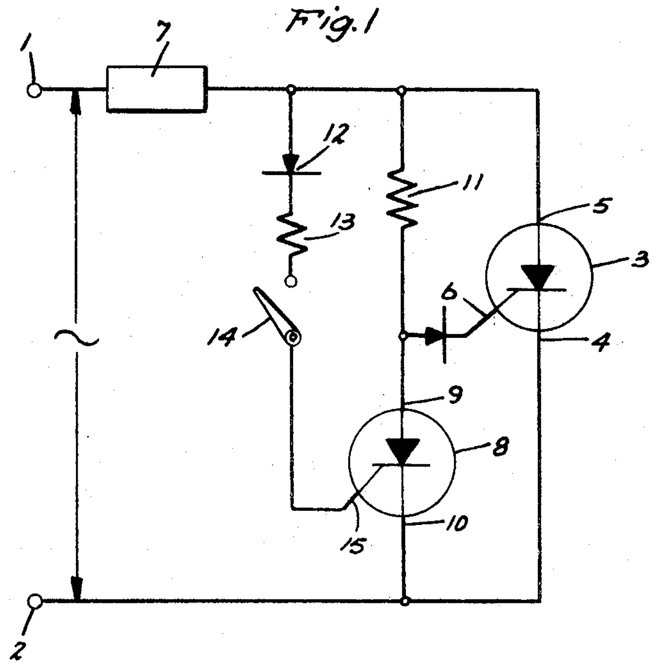
FIG. 1 is a schematic diagram of one embodiment of this invention.

A circuit for controlling the energization of a load by controlling the number of half-cycles of source voltage applied during the period of utilization is shown in FIG. 1. A source voltage is applied across terminal 1 and common terminal 2 of the circuit and across a gate controlled conducting device 3, having a cathode 4, an anode 5, and a gate electrode 6, and across a load 7. While FIG. 1 shows the use of an SCR, the gate controlled conducting device may be any latching device where a gate electrode, such as the gate electrode 6 of the SCR 3, causes it to change its conduction state so as to open a circuit when the circuit current is zero.

To control the state of conduction of the SCR 3, a second gate controlled conducting device 8 is connected to the SCR 3. The anode 9 and the cathode 10 of the gate controlled device 8 are connected across the gate-cathode junction of the SCR 3. When the gate controlled device 8 conducts, it shunts a current flow through a resistor 11 away from the gate-cathode junction of the SCR 3. Current may flow through a rectifier 12, a resistor 13, and a switching means 14 to the gate electrode 15 of the gate controlled device 8 when the switching means 14 closes the circuit to the gate electrode 15 to turn on the gate controlled device 8. The last-described circuit provides a control means for the gate controlled device 8 which may be modified to any of a number of forms well known to those skilled in the art. Thus, for some applications of this invention, a rheostat may constitute the switching means 14, presently shown, or as a mechanical switch, or a semiconductor device or semiconductor circuit may be used.

In this embodiment of this invention, the gate controlled conducting device 8 is shown as an SCR, however, it may comprise any latching device which can be controlled as by the gate electrode 15, to begin conducting and remain conducting even after a control signal has terminated, so as to continue to shunt the gate-cathode junction of the SCR 3. The SCR 8 is usually a lower power SCR than is the SCR 3 which must sustain the load current and the SCR 8 is thus sensitive to a lower gate current. The impedance of the resistors 11 and 13 is designed in accordance with the characteristics of the SCR's 3 and 8, respectively. These resistors are such that when the switching means 14 closes the gate circuit of the SCR 8 when the SCR's 3 and 8 are forward biased, the SCR 8 begins to conduct so as to shunt the gate-cathode junction of the SCR 3 before it can begin to conduct.

The operation of the circuit shown in FIG. 1 is as follows: When terminal 1 is negative in potential with respect to the common terminal 2, the SCR's 3 and 8 are reverse biased, as is the rectifier 12. Since no current can flow through the SCR 3, none can flow through the load 7.

When the terminal 1 becomes positive in potential with respect to the common terminal 2 and the switching means 14 has opened the gate circuit of the SCR 8, gate current flows through the resistor 11 and through the gate electrode 6 of the SCR 3 to turn on the SCR 3. Therefore, current flows through the load 7 from the source at the beginning of this half-cycle of the source voltage. This current continues to flow as long as the SCR 3 is forward biased, in accordance with the latching characteristics of the SCR. If the switching means 14 should close, the SCR 8 does not begin to conduct due to the small voltage across its anode and cathode due to the small anode-cathode voltage of the SCR 3.

If the switching means 14 has completed the gate circuit of the SCR 8 when the terminal 1 becomes positive in potential with respect to the common terminal 2, gate current flows through the rectifier 12 and resistor 13 to turn on the SCR 8 before current flow through the resistor 11 can turn on the SCR 3. Therefore, the SCR 8 shunts the current from the gate-cathode junction of the SCR 3 so that the SCR 3 cannot begin to conduct current. Even if the switching means 14 opens the gate circuit of the SCR 8 while the SCR 8 and the SCR 3 are still forward biased, the SCR 8 remains conducting due to its latching characteristics. Therefore, once the SCR 8 begins conducting during a half-cycle of the source voltage, the SCR 3 cannot begin conducting any time during this half-cycle.

Figure 2:
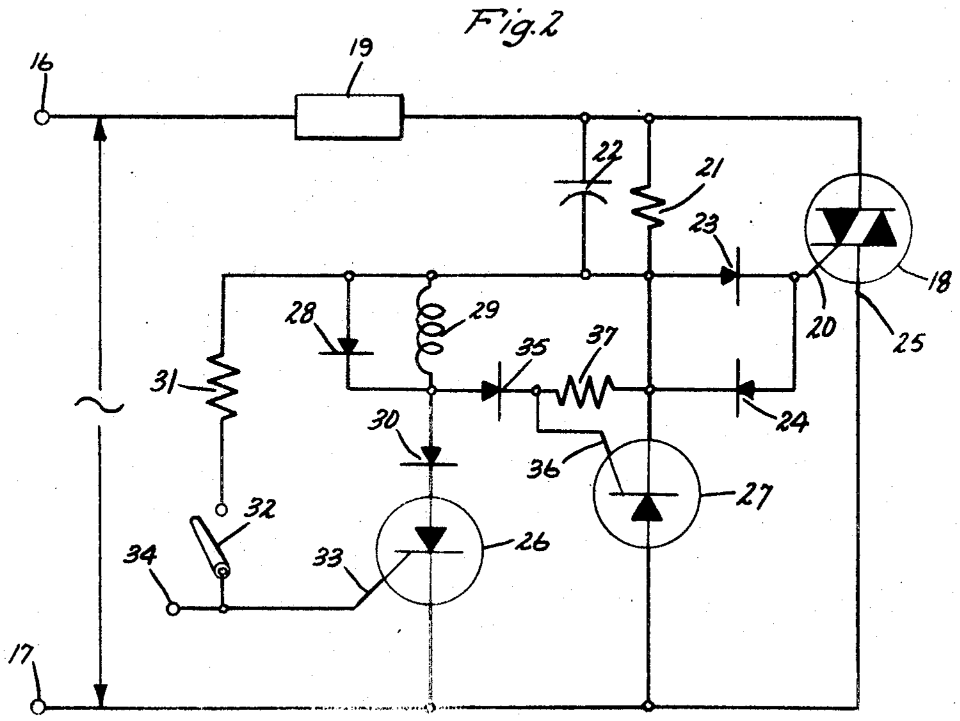
FIG. 2 is a schematic diagram showing another embodiment of this invention in a full-wave controlling circuit.

In many cases it is desirable to supply more energy to a load than can be controlled by a gate controlled device delivering only half-cycles of current. FIG. 2 shows one full-wave A-C current control circuit utilizing the principles of this invention. In this circuit, voltage is supplied from a power source across a terminal 16 and a common terminal 17 and through a gate controlled conducting device comprising a symmetrical switching triode device 18, often referred to as a TRIAC, to a load 19. Gate current may be coupled to a gate electrode 20 of the TRIAC 18 through a resistor 21, a capacitor 22, and either diode 23 or diode 24. The TRIAC 18 in this example is of the type which can be fired by either a positive current pulse through its gate electrode 20 and its first anode electrode 25 or by a negative current pulse through its gate electrode 20 and the first anode electrode 25. Therefore, when the potential at the terminal 16 is positive in polarity with respect to that at the terminal 17, a positive current pulse may flow through the diode 23, the gate electrode 20 and the first electrode 25 to fire the TRIAC 18. Similarly, when the potential at the electrode 16 is negative in polarity with respect to that at the terminal 17, a negative current pulse may flow through the diode 24, the gate electrode 20 and the first electrode 25 to fire the TRIAC 18.

In accordance with this invention, a control circuit is provided for the TRIAC 18 wherein one of a pair of gate controlled conducting devices, comprising the SCR's 26 and 27, control the firing of the TRIAC 18. The SCR's 26 and 27 are connected in an inverse parallel or a back-to-back relationship so that when the potential at the terminal 16 is positive with respect to that at the terminal 17, current may flow through the resistor 21 and the capacitor 22, and through a diode 28 and an inductor 29 to a diode 30 and the SCR 26. However, this current cannot flow unless a gate current is coupled through the resistor 21 and the capacitor 22 and through a resistor 31 and a switching means 32 to a gate electrode 33 of the SCR 26 to turn on the SCR 26. This gate current can flow as long as the switching means 32, which is shown for illustrative purposes as a mechanical switch in FIG. 2, closes the gate circuit. In the alternative, a positive gate current pulse may be provided across a terminal 34 and the terminal 17 to cause the SCR 26 to conduct current when it is forward biased.

When the SCR 26 conducts current, a majority of the current is carried by the diode 28 so that the inductor 29 may be a small radio-type choke, regardless of the magnitude of the current. During a subsequent half-cycle when the terminal 16 is negative in polarity with respect to the terminal 17, the voltage across the inductor 29 changes, and current from the inductor 29 free-wheels through a diode 35 connected between the inductor 29 and a gate electrode 36 of the SCR 27. A resistor 37 protects the SCR 27 from the effects of transient voltages. When the gate current flows from the inductor 29 to the gate electrode 36, the SCR 27 conducts since the voltage across the terminals 16 and 17 now forward biases the SCR 27. Thus, it can be seen that either the SCR 26 or the SCR 27 may shunt current from the gate-first anode junction of the TRIAC 18 to prevent the TRIAC 18 from firing during a half-cycle of the voltage from the source.

In operation, when voltage from the source causes the terminal 16 to be negative in potential with respect to the terminal 17, current flows through the resistor 21 and the capacitor 22 and through the diode 24 and the gate electrode 20 to fire the TRIAC 18. The TRIAC 18 continues to conduct current during the remaining portion of this half-cycle so that the load 19 is energized. If the switching means 32 has opened the gate circuit of the SCR 26 as the terminal 16 becomes positive in polarity with respect to the terminal 17, gate current flows from the resistor 21 and the capacitor 22, through the diode 23 and the gate electrode 20 to fire the TRIAC 18. Thereafter, during this half-cycle the load 19 is energized.

If the switching means 32 has closed the gate circuit of the SCR 26 when the terminal 16 becomes positive in polarity with respect to the terminal 17, or a positive current pulse is supplied across the terminals 34 and 17, the SCR 26 shunts the gate-first anode junction of the TRIAC 18 during this half-cycle of the voltage at the terminals 16 and 17. During the succeeding half-cycle, when the voltage at the terminal 16 is negative in polarity with respect to that at the terminal 17, current free-wheels from the inductor 29 and through the diode 35 and the gate electrode 36 to turn on the SCR 27. Thus, during this half-cycle of the voltage from the source, the SCR 27 shunts the gate-first anode junction of the TRIAC 18 so that the load 19 is not energized. If the switching means 32 is closed after the TRIAC 18 begins to conduct current, the SCR 26 cannot be fired due to the small voltage drop across the SCR 26.

The control circuit of the invention is particularly advantageous for continuous, automatic control purposes. For example, in heater control circuits, it may be modified to apply power to a heater load over a portion of a timing period determined by a timing circuit. Thus, by modulating the output of the timing circuit in accordance with a change in temperature, the temperature of an environment being heated may be controlled. Embodiments of this invention directed more specifically toward control by means of a modulated output are described below.

Figure 3:
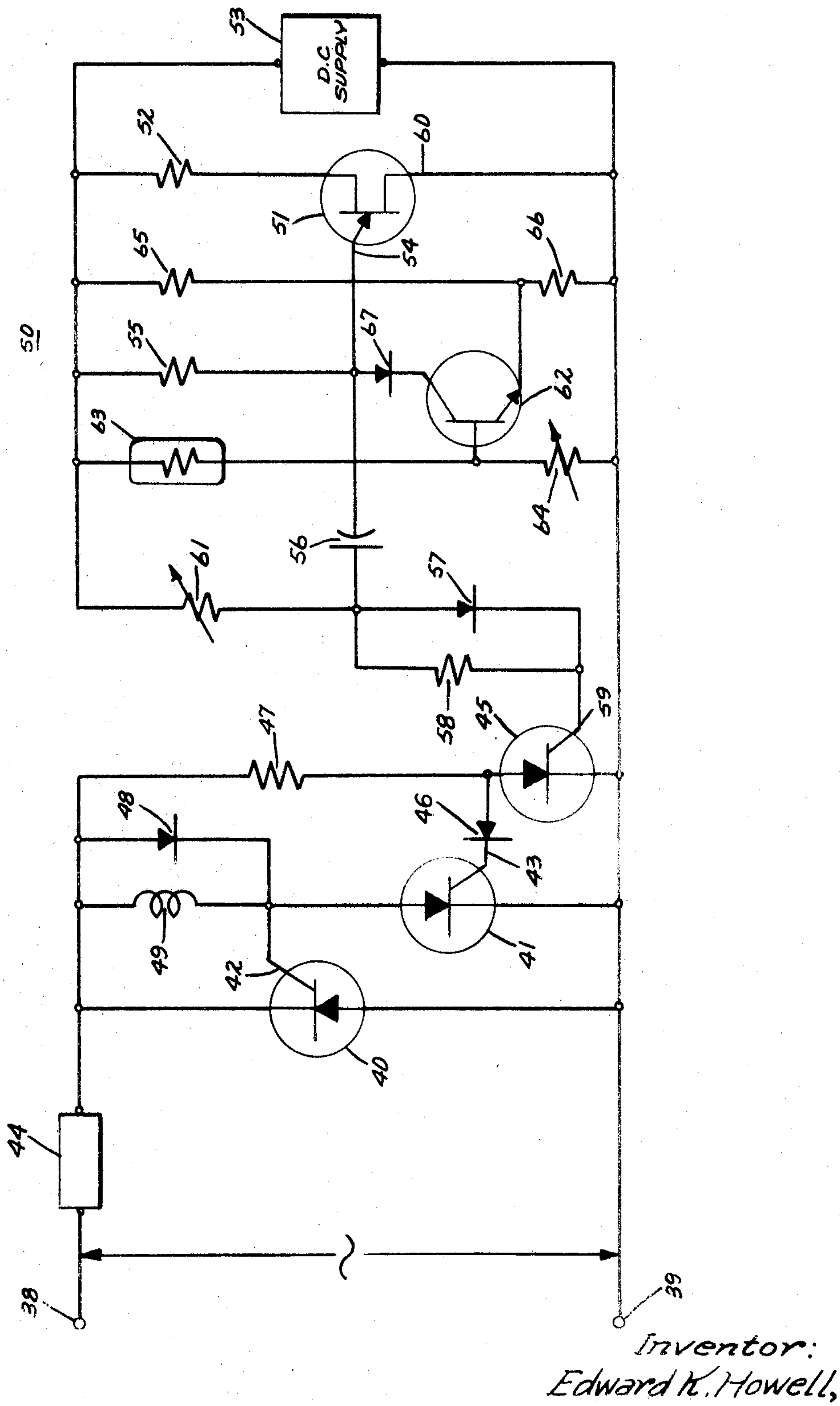
FIG. 3 is a schematic diagram showing a modification of this invention, as used for automatic, continuous control purposes.

FIG. 3 shows an embodiment of this invention wherein a relaxation oscillator controls the current flow through a load by controlling the gate current flow of a gate controlled conducting device which shunts the gate-cathode junction of a second gate controlled device. Voltage is applied from a source across terminals 38 and 39 and through a pair of gate controlled conducting devices, comprising the SCR's 40 and 41, having gate electrodes 42 and 43, respectively, and to a load 44. Where the circuit shown in FIG. 3 is thermal controlled, as shown in this embodiment, the load 44 may be an electric heater. The SCR's 40 and 41 are high powered gate controlled devices which can carry a high load current needed for a load such as a heater load.

A gate controlled conducting device comprising an SCR 45 is connected through a diode 46 between the gate electrode 43 and the cathode of the SCR 41 in accordance with this invention. A resistor 47 conducts current from the load 44 to the anodes of both the diode 46 and the SCR 45. When the SCR 41 conducts current, this current flows through a diode 48 and an inductor 49 to the anode of the SCR 41. At the beginning of the succeeding half-cycle of the voltage source, the voltage at the inductor 49 changes polarity so as to provide gate current at the gate electrode 42 of the SCR 40 to turn on the SCR 40 when it is forward biased.

A circuit for controlling the gate current for the SCR 45 basically comprises a unijunction transistor relaxation oscillator circuit 50 of the type set forth in the U.S. Pat. 2,968,770—Sylvan, issued on Jan. 17, 1961, which can control the time during which the SCR 45 is conducting and non-conducting. This timing circuit comprises a unijunction transistor (UJT) 51 connected across a D–C power supply 53 through a resistor 52. During a first half-cycle of the timing circuit 50, when the emitter 54 of the UJT 51 is back-biased, current flows through a resistor 55, a capacitor 56, and a parallel-connected diode 57 and resistor 58 to a gate electrode 59 of the SCR 45. This current both charges the capacitor 56 and provides a gate current which turns on the SCR 45 if it is forward biased.

When the voltage at the capacitor forward biases the emitter 54 of the UJT 51, the resistance between the emitter 54 and a base 60 of the UJT 51 decreases so that the current flows from the resistor 55 and from a resistor 61 and the capacitor 56 to the emitter 54 of UJT 51. The diode 57 now becomes non-conducting so that a current does not flow through the gate electrode 59 of the SCR 45. The current continues to flow in this manner during this second half-cycle until a voltage developed at the junction of the resistor 61 and the capacitor 56 forward biases the diode 57 once again so that it shunts current from the emitter of the UJT 51. Thereafter, the UJT 51 stops firing and the first half-cycle starts once again with the capacitor 56 being charged by a current flowing from the resistor 55.

The output from this oscillator circuit is modulated by a thermal sensitive transistor bridge circuit including a transistor 62 having its base biased by means of a thermistor 63, a negative temperature coefficient device, and a variable resistor 64, comprising two legs of the bridge circuit which are connected across the D–C supply 53. The emitter electrode of the transistor 62 is connected between resistors 65 and 66 which comprise the other two legs of the bridge, also connected across the D–C supply 53. A diode 67 interconnects the emitter 54 of the UJT 51 and the collector electrode of the transistor 62. The variable resistor 64 adjusts the bias at the base electrode of the transistor 62 to a predetermined level at a desired temperature. Thus, when the temperature changes, causing the resistance of the thermistor 63 to change, the bias at the base of the transistor 62 varies as well so that the transistor 62 conducts more or less current away from the junction of the emitter electrode 54 of the UJT 51 and the capacitor 56 in accordance with the increase and decrease of the temperature.

When the temperature of the thermistor decreases so that its impedance increases, the transistor 62 is biased toward cutoff. At this time, it may draw less current through its collector electrode than previously. The period of the UJT relaxation oscillator 50 becomes shorter than before since less current is shunted from the capacitor 56 by the transistor bridge circuit and the capacitor charges more quickly to forward bias the emitter 54. Therefore, gate current flows through the gate electrode 59 of the SCR 45 for a shorter time so that the SCR's 40 and 41 are conducting and the load 44 is energized by a greater number of cycles of the voltage source. However, when the temperature of the thermistor 63 rises so that its impedance decreases, the transistor 62 begins to conduct current more heavily from the junction of the emitter electrode 54 and the capacitor 56. During the half-cycle of the UJT oscillator 50 when the capacitor 56 is charged through the diode 57 and the resistor 58 so as to provide gate current for the SCR 45, the transistor 62 tends to shunt charging current from the capacitor 56. Therefore, it takes a longer time for the current flow from the resistor 55 and through the capacitor 56 to charge the capacitor 56 to a voltage level whereat it forward biases the emitter 54 of UJT 51. Gate current now flows through the SCR 45 for a longer time so that it holds the SCR's 40 and 41 non-conducting, and the load 44 is energized to a lesser extent, by fewer cycles of the voltage source.

In operation, the energization of the SCR's 40 and 41 can begin whenever the SCR 41 is forward biased at the same time that the SCR 45 does not shunt the emitter-cathode junction of the SCR 41. Gate current is available to turn on the SCR 45 during that half-cycle of the UJT relaxation oscillator 50 when the capacitor 56 is charging up to the forward bias level of the emitter 54 of the UJT 51 through the resistor 55 and the capacitor 57 and the resistor 58. This half-cycle of the oscillator 50 is lengthened when the temperature of the thermistor 63 increases since the base electrode of the transistor 62 is biased on so that the transistor 62 conducts a greater current away from the capacitor 56. Therefore, the heater load 44 is energized for a shorter period of time and the temperature can decrease. As the temperature decreases, the transistor 62 is biased toward cutoff by the thermistor 63 so as to affect the cycle of the oscillator 50 to a lesser extent, and the load 44 is energized more fully. Thus, the output of the oscillator 50 is modulated with the change in the temperature of the thermistor 63 to affect the energization of the load 44.

Figure 4:
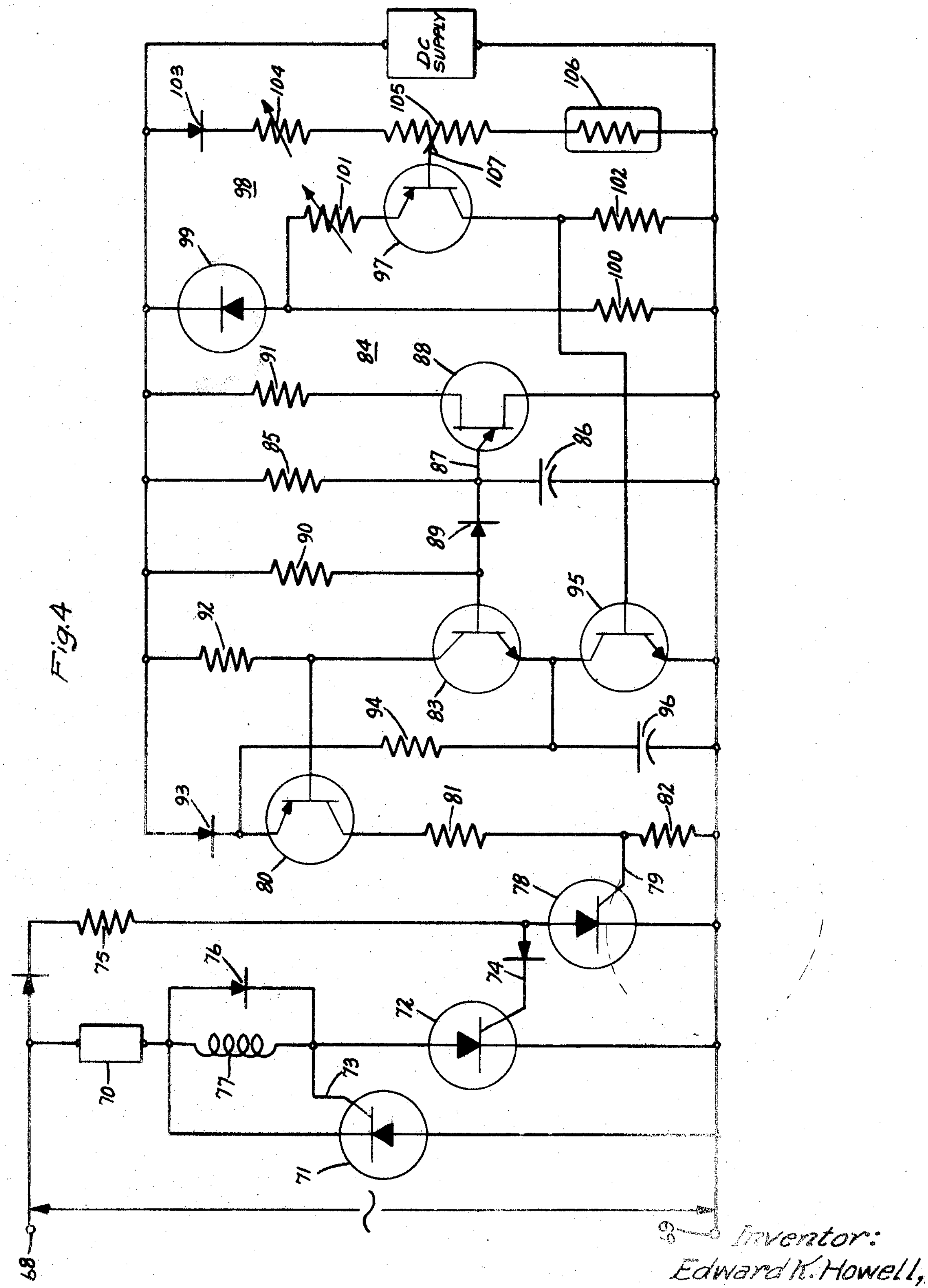
FIG. 4 is a schematic diagram showing still another modification of this invention as used for automatic continuous control purposes.

FIG. 4 shows another embodiment of my invention wherein a relaxation oscillator controls the current flow through a load by controlling the gate current flow through a gate controlled conducting device which shunts the gate-cathode junction of another gate controlled device. Voltage from the source is applied across the terminals 68 and 69 and through gate controlled devices comprising SCR's 71 and 72, having gate electrodes 73 and 74, respectively. Gate current is supplied to the gate electrode 74 through a resistor 75. Load current flows through a diode 76 and an inductor 77 to the SCR 72 during a half-cycle of the source voltage when the inductor 72 is forward biased and gate current can flow through the gate electrode 74. A gate controlled conducting device comprising an SCR 78 having a gate electrode 79 is connected across the gate-cathode junction of the SCR 72. This last-described circuit functions in a manner similar to that of the corresponding circuit including the SCR's 40, 41, and 45, described with respect to FIG. 3. Thus, when gate current is supplied to the gate electrode 79 at the beginning of a half-cycle when the SCR's 72 and 78 are forward biased, the SCR 78 shunts the gate-cathode junction of the SCR 72 so that the SCR 72 is held non-conducting.

However, the circuit for controlling the gate current for the SCR 78 is varied from that shown with respect to FIG. 3 so as to provide a circuit having a greater temperature sensitivity at a lower cost by using a larger number of less-sensitive, more-inexpensive components. Essentially, when a transistor 80 conducts current, it supplies gate current to the gate electrode 79 of the SCR 78, connected between the resistors 81 and 82. Thus, the transistor 80 may be said to comprise a switching means similar to switching means 32 in FIG. 2. The transistor 80 and a transistor 83 are both either conducting or non-conducting simultaneously. When the transistor 83 conducts, the voltage at its collector electrode decreases, decreasing the voltage at the base electrode of the PNP transistor 80 connected thereto, thereby turning on the transistor 80 as well.

The conduction state of the transistor 83 is controlled by a UJT oscillator 84 which generates a sawtooth voltage at the junction of a resistor 85, a capacitor 86, an emitter electrode 87 of a UJT 88, and the cathode of a diode 89. This sawtooth wave is generated by the charging of the capacitor 86 through the resistor 85 and the discharging of the capacitor 86 through the emitter 87 of the UJT 88 after the voltage at the capacitor 86 forward biases the emitter 87. When the anode voltage of the diode 89 is below that of the sawtooth wave, current flows through a resistor 90 to the base electrode of the transistor 83. When the voltage at the anode of the diode 89 is above that of the sawtooth voltage generated at the emitter 87, the capacitor 86 is also charged by current flowing from the D-C supply through the resistor 90. The D-C supply is also connected through a resistor 91 to the UJT 88.

Various circuit means are provided to bias the transistors in the controlling circuit. The collector electrode of the transistor 83 is connected through a resistor 92 to the D-C supply. The D-C supply voltage is also coupled through a diode 93 to the emitter electrode of the transistor 80 and through a resistor 94 to the junction between the emitter electrode of the transistor 83 and the collector electrode of a transistor 95. A capacitor 96 is connected across the transistor 95. The base electrode of the transistor 95 is biased by the voltage level at the collector electrode of a transistor 97, connected in a thermistor bridge circuit 98.

Two legs of the thermistor bridge circuit 98 comprise a Zener diode 99 and a resistor 100 connected in series across the D-C supply. A variable resistor 101 is connected between the junction of the Zener diode 99 and the resistor 100, and the emitter electrode of the transistor 97. A resistor 102 interconnects the collector electrode of the transistor 97 with one side of the D-C supply. The third and fourth legs of the thermistor bridge circuit 98 comprise a series circuit including a diode 103, a resistor 104, a potentiometer 105, and a thermistor 106 connected across a D-C supply. The position of a slide wire 107 of the potentiometer 105 determines which portion of the potentiometer 105 is connected in each of the third and fourth legs of the thermistor bridge circuit 98. The slide wire 107 is connected to the base electrode of the transistor 97 so that the base-emitter junction of the transistor 97 is biased by a voltage dependent upon the difference in potential between the voltage at the junction of the Zener diode 99 and the resistor 100, and the voltage at the slide wire 107 of the potentiometer 105. Thus, the current flows through the transistor 97 when the voltage at the slide wire 107 is below the voltage at the emitter electrode of the transistor 97.

In operation, the thermistor 106 may be mounted in an environment which is heated by heat produced by a current flow through a load 70. When the SCR's 71 and 72 conduct current, the load 70 is energized so that more heat is produced. The SCR 72 is energized whenever it is forward biased and the SCR 78 is turned off so that gate current can flow through the gate electrode 74. A timing circuit comprising the oscillator 84 provides a period during a portion of which the output of the control circuit may allow the supply voltage to energize the load 70.

The flow of gate current through the gate electrode 79 is controlled by the temperature of the thermistor 106. When the temperature of the thermistor rises so that its resistance decreases, the voltage at the base electrode of the transistor 97 decreases in magnitude so that the transistor 97 is turned on more fully. The voltage at the collector of the transistor 97 increases with an increase in the current flow through the transistor 97. Therefore, the potential at the base electrode of the transistor 95 increases as well to cause the transistor 95 to conduct a larger current. With the increase in the current flow through the transistor 95, the potential at the collector electrode of the transistor 95, and thus at the emitter elecrode of the transistor 83, decreases. Therefore, the potential at the base electrode of the transistor 83 decreases as well.

As was pointed out above with respect to the description of operation of the UJT oscillator 84, when the potential at the anode of the diode 89 is above that of the sawtooth wave generated at the emitter electrode 87 of UJT 88 the diode 89 conducts. When the diode 89 conducts, base current which ordinarily flows through the resistor 90 to turn on the transistor 83 is shunted to charge the capacitor 86. Now when the potential at the emitter electrode of the transistor 83 decreases, as just described, the base current is shunted from the base electrode for a smaller portion of the oscillator period so that the transistor 83 conducts for a longer period of time.

Whenever the transistor 83 conducts current, the transistor 80 is biased toward conduction as well. Therefore, at this time gate current flows through the resistor 81 to the gate electrode 79 of the SCR 78 to stop the SCR 72 from beginning to conduct current if it is forward biased. From the foregoing, it can be seen that when the temperature of the thermistor 106 increase, the SCR's 71 and 72 are non-conducting for a longer time so that the heater load 70 is energized to a lesser extent.

It can also be seen that if the temperature of the thermistor 106 decreases, it has an opposite effect on the SCR's 71 and 72 so that they conduct for a longer period of time to energize the load 70 more fully. Thus, when the temperature at the thermistor 106 decreases so that its resistance increases, the transistor 97 is biased toward cutoff. A smaller current flow through the transistor 97 decreases the bias across the base-emitter junction of the transistor 95. The transistor 95 conducts less current than before, and as a result, its collector electrode is at a higher potential. This effectively biases the emitter electrode of the transistor 93 at a higher potential level. Thus, the potential at the anode of the diode 89 is above the potential of the sawtooth wave generated at the emitter 87 for a larger percentage of the sawtooth wave period. Since the base current for the transistor 83 is shunted to the capacitor 86 during this time, the transistor 83, and the transistor 80 which is biased thereby, conducts for a smaller percentage of the time. For this reason, gate current flows through the SCR 78 to cause it to shunt the gate-cathode junction of the SCR 72 for a smaller percentage of the period of oscillator 84. Thus, the SCR 72 is turned on for a longer period of time and the heater load 70 is energized to a greater extent.

This invention is not limited to the particular details of the embodiment illustrated, and I contemplate that various modifications and applications will occur to those skilled in the art. It is therefore my intention that the appended claims cover such modifications and applications as do not depart from the direct spirit and scope of this invention.

What I claim as new and desire to secure by Letters Patent of the United States is:

1. A circuit for controlling current flow from an alternating current source through a load comprising: a symmetrical switching triode having a first gate electrode and a first anode electrode, means for connecting said symmetrical switching device between the source and the load, first and second silicon controlled rectifiers having second and third gate electrodes, respectively, means for connecting said silicon controlled rectifiers between said first gate electrode and said first anode electrode so that when either of said silicon controlled rectifiers is energized said symmetrical switching triode cannot begin to conduct, circuit means connected to said second gate electrode to control the energization state of said first silicon controlled rectifier, said circuit means being controllable to cause said first silicon controlled rectifier to be energized during one half-cycle of the source voltage and thereafter to continue to conduct current during this half-cycle of the voltage, so that said symmetrical switching device can only begin to conduct at the beginning of this half-cycle of the source voltage, and circuit means responsive to the current flow through said first silicon controlled rectifier, means connecting said circuit means to said third gate electrode for providing current to said third gate electrode at the beginning of a succeeding half-cycle of the source voltage when said first silicon controlled rectifier conducts during the above-mentioned one half-cycle.

2. A circuit for controlling current flow from an alternating-current source to a load comprising: a first gate controlled conducting device having a first gate electrode, means for connecting said gate controlled device to said source and the load, a second gate controlled conducting device having a second gate electrode, means for connecting said second gate controlled device to said first gate electrode so that the state of conduction of said first gate controlled device may change when the energization state of said second gate controlled device changes, an oscillator circuit, means for connecting an output signal from said oscillator circuit to said second gate electrode to control the energization of said second gate controlled device, and a circuit for producing an error signal in response to an error detected by a condition responsive device, means for interconnecting the last-mentioned circuit and said oscillator for affecting the output of said oscillator in accordance with the error signal so that the output signal of said oscillator circuit may cause said second gate controlled device to enter into and thus maintain a first energization state during one half-cycle of the source voltage, whereby said first gate controlled device can only begin to conduct at the beginning of a half-cycle of the source voltage.

3. A circuit according to claim 2 wherein said oscillator circuit comprises a unijunction transistor relaxation oscillator circuit and said error signal producing circuit comprises a transistorized bridge circuit.

4. A circuit for controlling current flow from an alternating-current source to a load comprising: a first gate controlled conducting device having a first gate electrode, means for connecting said gate controlled device to said source and the load, a second gate controlled conducting device having a second gate electrode, means for connecting said second gate controlled device to said first gate electrode so that the state of conduction of said first gate controlled device may change when the energization state of said second gate controlled device changes, a unijunction transistor relaxation oscillator circuit, means for connecting an output signal from said oscillator circuit to said second gate electrode to control the energization of said second gate controlled device, and a thermal-sensitive transitsorized bridge circuit, means for interconnecting said bridge circuit and said oscillator for affecting the output of said oscillator in accordance with a deviation in temperature sensed by said bridge circuit so that the output signal of said oscillator circuit may cause said second gate controlled device to become conducting during one half-cycle of the source voltage, whereby said first gate controlled device can only begin to conduct at the beginning of a half-cycle of the source voltage.

References Cited

UNITED STATES PATENTS

| | | | |
|---|---|---|---|
| 3,225,280 | 12/1965 | Happe et al. | 307—252 X |
| 3,337,792 | 8/1967 | Engelson | 323—22 |
| 3,335,291 | 8/1967 | Gutzwiller | 307—305 |
| 3,360,713 | 12/1967 | Howell | 307—252 |
| 3,390,275 | 6/1968 | Baker | 307—252 X |

DONALD D. FORRER, Primary Examiner

B. P. DAVIS, Assistant Examiner

U.S. Cl. X.R.

307—305, 251